(12) United States Patent
Hatano et al.

(10) Patent No.: US 9,087,964 B2
(45) Date of Patent: Jul. 21, 2015

(54) LIGHT-EMITTING DEVICE

(71) Applicants: Kaoru Hatano, Atsugi (JP); Naoyuki Senda, Atsugi (JP); Manabu Niboshi, Osaka (JP); Katsuhiro Kikuchi, Osaka (JP); Shinichi Kawato, Osaka (JP); Takashi Ochi, Osaka (JP); Yuto Tsukamoto, Osaka (JP); Tomohiro Kosaka, Osaka (JP); Tomofumi Osaki, Osaka (JP)

(72) Inventors: Kaoru Hatano, Atsugi (JP); Naoyuki Senda, Atsugi (JP); Manabu Niboshi, Osaka (JP); Katsuhiro Kikuchi, Osaka (JP); Shinichi Kawato, Osaka (JP); Takashi Ochi, Osaka (JP); Yuto Tsukamoto, Osaka (JP); Tomohiro Kosaka, Osaka (JP); Tomofumi Osaki, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 14/054,051

(22) Filed: Oct. 15, 2013

(65) Prior Publication Data
US 2014/0103368 A1 Apr. 17, 2014

(30) Foreign Application Priority Data
Oct. 17, 2012 (JP) ................. 2012-230151

(51) Int. Cl.
| H01L 33/00 | (2010.01) |
|---|---|
| H01L 29/18 | (2006.01) |
| H01L 33/36 | (2010.01) |
| H01L 27/32 | (2006.01) |
| H01L 51/50 | (2006.01) |
| H01L 51/52 | (2006.01) |

(52) U.S. Cl.
CPC ............ H01L 33/36 (2013.01); H01L 27/3246 (2013.01); *H01L 51/5044* (2013.01); *H01L 51/525* (2013.01)

(58) Field of Classification Search
CPC ........................................ H01L 33/08
USPC ............................................. 257/88
See application file for complete search history.

(56) References Cited

U.S. PATENT DOCUMENTS

| 5,119,156 | A | 6/1992 | Kawahara et al. |
| 6,373,453 | B1 | 4/2002 | Yudasaka |
| 6,392,722 | B1 | 5/2002 | Sekime et al. |

(Continued)

FOREIGN PATENT DOCUMENTS

| JP | 11-339958 A | 12/1999 |
| JP | 2001-148291 | 5/2001 |

(Continued)

*Primary Examiner* — Shaun Campbell
*Assistant Examiner* — Ismail Muse
(74) *Attorney, Agent, or Firm* — Eric J. Robinson; Robinson Intellectual Property Law Office, P.C.

(57) ABSTRACT

Occurrence of a crosstalk phenomenon is suppressed in a light-emitting device including a tandem element. A light-emitting device includes a first lower electrode and a second lower electrode over an insulating layer; a partition which is formed over the insulating layer and positioned between the first lower electrode and the second lower electrode; a projecting object formed over the partition; a first light-emitting unit over each of the first lower electrode, the partition, the projecting object, and the second lower electrode; an intermediate layer over the first light-emitting unit; a second light-emitting unit over the intermediate layer; and an upper electrode over the second light-emitting unit. A recess is formed by a side surface of the projecting object and a side surface of the partition.

19 Claims, 12 Drawing Sheets

(56) References Cited

U.S. PATENT DOCUMENTS

| | | | |
|---|---|---|---|
| 6,420,834 B2 | 7/2002 | Yamazaki et al. | |
| 6,469,439 B2 | 10/2002 | Himeshima et al. | |
| 6,548,961 B2 * | 4/2003 | Barth et al. | 315/169.3 |
| 6,555,968 B2 | 4/2003 | Yamazaki et al. | |
| 6,559,594 B2 | 5/2003 | Fukunaga et al. | |
| 6,597,121 B2 | 7/2003 | Imura | |
| 6,614,174 B1 | 9/2003 | Urabe et al. | |
| 6,618,029 B1 | 9/2003 | Ozawa | |
| 6,720,198 B2 | 4/2004 | Yamagata et al. | |
| 6,750,618 B2 | 6/2004 | Yamazaki et al. | |
| 6,768,257 B1 | 7/2004 | Yamada et al. | |
| 6,798,132 B2 | 9/2004 | Satake | |
| 6,815,723 B2 | 11/2004 | Yamazaki et al. | |
| 6,828,726 B2 | 12/2004 | Sakurai et al. | |
| 6,891,327 B2 * | 5/2005 | Duineveld et al. | 313/505 |
| 6,969,291 B2 | 11/2005 | Urabe et al. | |
| 6,991,506 B2 | 1/2006 | Yamada et al. | |
| 6,992,439 B2 | 1/2006 | Yamazaki et al. | |
| 7,015,503 B2 | 3/2006 | Seki et al. | |
| 7,057,209 B2 | 6/2006 | Yamazaki et al. | |
| 7,095,172 B2 * | 8/2006 | Sakamoto et al. | 313/506 |
| 7,098,602 B2 | 8/2006 | Yamazaki et al. | |
| 7,173,281 B2 | 2/2007 | Hirakata et al. | |
| 7,214,959 B2 | 5/2007 | Seki et al. | |
| 7,221,338 B2 | 5/2007 | Yamazaki et al. | |
| 7,265,391 B2 | 9/2007 | Yamazaki et al. | |
| 7,273,801 B2 | 9/2007 | Seki et al. | |
| 7,384,860 B2 | 6/2008 | Nakamura et al. | |
| 7,402,948 B2 | 7/2008 | Yamazaki et al. | |
| 7,420,210 B2 | 9/2008 | Yamazaki et al. | |
| 7,423,293 B2 | 9/2008 | Yamagata et al. | |
| 7,442,955 B2 | 10/2008 | Seki et al. | |
| 7,585,761 B2 | 9/2009 | Yamazaki et al. | |
| 7,623,098 B2 | 11/2009 | Yamazaki et al. | |
| 7,623,099 B2 | 11/2009 | Yamazaki et al. | |
| 7,623,100 B2 | 11/2009 | Yamazaki et al. | |
| 7,662,011 B2 | 2/2010 | Yamazaki et al. | |
| 7,683,535 B2 | 3/2010 | Fukunaga et al. | |
| 7,692,186 B2 | 4/2010 | Yamazaki et al. | |
| 7,697,106 B2 | 4/2010 | Sawasaki et al. | |
| 7,719,014 B2 | 5/2010 | Yamazaki et al. | |
| 7,745,993 B2 | 6/2010 | Fukunaga et al. | |
| 7,753,751 B2 | 7/2010 | Yamazaki | |
| 7,792,489 B2 | 9/2010 | Hirakata et al. | |
| 7,902,746 B2 | 3/2011 | Park | |
| 7,932,518 B2 | 4/2011 | Seki et al. | |
| 7,977,876 B2 | 7/2011 | Yamazaki et al. | |
| 7,982,206 B2 | 7/2011 | Yamazaki et al. | |
| 7,990,348 B2 | 8/2011 | Yamazaki et al. | |
| 8,026,531 B2 | 9/2011 | Seo et al. | |
| 8,089,066 B2 | 1/2012 | Yamazaki et al. | |
| 8,119,468 B2 | 2/2012 | Miyairi et al. | |
| 8,138,032 B2 | 3/2012 | Miyairi et al. | |
| 8,194,008 B2 | 6/2012 | Yamazaki et al. | |
| 8,232,940 B2 * | 7/2012 | Okano | 345/83 |
| 8,237,355 B2 | 8/2012 | Yamazaki | |
| 8,432,097 B2 | 4/2013 | Hirakata et al. | |
| 8,441,185 B2 | 5/2013 | Kuwabara et al. | |
| 2001/0004469 A1 | 6/2001 | Himeshima et al. | |
| 2002/0047514 A1 | 4/2002 | Sakurai et al. | |
| 2002/0093286 A1 | 7/2002 | Ohshita et al. | |
| 2003/0146439 A1 | 8/2003 | Yamazaki et al. | |
| 2003/0189400 A1 | 10/2003 | Nishio et al. | |
| 2004/0061118 A1 | 4/2004 | Yamazaki et al. | |
| 2006/0081844 A1 | 4/2006 | Hirosue et al. | |
| 2007/0015430 A1 | 1/2007 | Nishio et al. | |
| 2007/0045621 A1 | 3/2007 | Suzuki et al. | |
| 2007/0194321 A1 | 8/2007 | Yamazaki et al. | |
| 2009/0009069 A1 * | 1/2009 | Takata | 313/504 |
| 2009/0020751 A1 | 1/2009 | Seki et al. | |
| 2010/0171138 A1 | 7/2010 | Yamazaki et al. | |
| 2011/0133666 A1 * | 6/2011 | Arai | 315/291 |
| 2011/0266548 A1 | 11/2011 | Yamazaki et al. | |
| 2011/0273080 A1 | 11/2011 | Kimura et al. | |
| 2012/0007110 A1 | 1/2012 | Seo et al. | |
| 2012/0217516 A1 * | 8/2012 | Hatano et al. | 257/88 |
| 2012/0273804 A1 | 11/2012 | Hatano | |
| 2012/0305922 A1 | 12/2012 | Yamazaki | |
| 2012/0326201 A1 * | 12/2012 | Ohnuma et al. | 257/99 |
| 2013/0001620 A1 | 1/2013 | Sugisawa et al. | |
| 2014/0014985 A1 * | 1/2014 | Sonoda et al. | 257/89 |

FOREIGN PATENT DOCUMENTS

| | | |
|---|---|---|
| JP | 2001-195008 | 7/2001 |
| JP | 2003-059671 A | 2/2003 |
| JP | 2003-123969 A | 4/2003 |
| JP | 2003-243171 | 8/2003 |
| JP | 2003-243171 A | 8/2003 |
| JP | 2003-257650 | 9/2003 |
| JP | 2005-235491 | 9/2005 |
| JP | 2005-235491 A | 9/2005 |
| JP | 2006-302870 | 11/2006 |
| JP | 2007-141821 A | 6/2007 |
| JP | 2008-234885 | 10/2008 |
| JP | 2010-027591 | 2/2010 |

* cited by examiner

LIGHT-EMITTING DEVICE

BACKGROUND OF THE INVENTION

1. Field of the Invention

One embodiment of the present invention relates to a light-emitting device including a tandem element.

2. Description of the Related Art

Commercialization of organic EL displays is accelerating. Displays are increasingly required to provide high luminance for outdoor use. It is known that the luminance of an organic EL element increases in proportion to electric current and light emission at high luminance can be achieved.

However, a large current flow accelerates deterioration of organic EL elements. Thus, if high luminance can be achieved with a small amount of current, light-emitting elements can have longer lifetime. In this regard, a tandem element in which a plurality of light-emitting units is stacked has been proposed as a light-emitting element capable of providing high luminance with a small amount of current (see Patent Document 1, for example).

Note that in this specification, a light-emitting unit refers to a layer or a stacked body which includes one region where electrons and holes injected from both ends are recombined.

A tandem element in which n light-emitting units of one embodiment are stacked between electrodes can provide light emission comparable to that of one light-emitting element (single element) by making current with a density of 1/n of that of the light-emitting element (single element) flow through each light-emitting unit. The tandem element can achieve n times as high luminance as the single element at the same current density.

One problem of a light-emitting panel in which tandem elements are provided adjacently is occurrence of a crosstalk phenomenon. The crosstalk phenomenon refers to a phenomenon in which, in the case where a highly conductive layer is provided in adjacent tandem elements, current leaks from one tandem element into another adjacent tandem element through the highly conductive layer.

A tandem element includes a stack of a plurality of layers with a highly conductive intermediate layer therebetween, and includes a layer with high conductivity and a layer with low conductivity because of its structure. In addition, in the tandem element, a highly conductive carrier-injection layer containing a mixed material of an organic compound and a metal oxide, a conductive high molecular compound, or the like is often used in order to decrease driving voltage. Furthermore, in the tandem element, electrical resistance between an anode and a cathode is higher than in a single element; thus, current is easily transmitted to an adjacent pixel through the highly conductive layer.

FIG. 12 is a schematic diagram illustrating occurrence of a crosstalk phenomenon due to a highly conductive intermediate layer 86. FIG. 12 shows a cross section of a light-emitting panel (white panel) including three tandem elements arranged in the form of stripes and configured to emit white light, in which only a second tandem element (B line, blue line) is driven.

The light-emitting panel includes first to third tandem elements which are adjacent to one another. The first tandem element (R line, red line) is provided between an upper electrode 81 and a first lower electrode 82. The second tandem element is provided between the upper electrode 81 and a second lower electrode 83. The third tandem element (G line, green line) is provided between the upper electrode 81 and a third lower electrode 84.

In each of the first to third tandem elements, a first light-emitting unit 85, the intermediate layer 86, and a second light-emitting unit 87 are sequentially stacked. For example, when the first light-emitting unit 85 includes a light-emitting layer capable of emitting blue light and the second light-emitting unit 87 includes a light-emitting layer capable of emitting green light and a light-emitting layer capable of emitting red light, each tandem element can provide white light emission.

In FIG. 12, a light-transmitting electrode is used as the upper electrode, and a counter glass substrate 88 is provided over the upper electrode. The counter glass substrate 88 is provided with a blue color filter, a red color filter, and a green color filter which are not illustrated. The red color filter, the blue color filter, and the green color filter overlap with the first lower electrode 82, the second lower electrode 83, and the third lower electrode 84, respectively.

When only the blue line is driven in the above-described light-emitting panel by application of a voltage between the second lower electrode 83 and the upper electrode 81, current might leak into the adjacent first or third tandem element through the highly conductive intermediate layer 86, causing the red or green line to emit light and a crosstalk phenomenon to occur.

FIG. 13 is a schematic diagram illustrating occurrence of a crosstalk phenomenon due to a highly conductive carrier-injection layer (hole-injection layer or electron-injection layer) 89, and shows a cross section of a light-emitting panel (white panel) in which only a blue line is driven.

In each of first to third tandem elements, a first light-emitting unit 85 including the highly conductive carrier-injection layer 89, an intermediate layer 86, and a second light-emitting unit 87 are sequentially stacked. As an example of the carrier-injection layer 89, a highly conductive layer containing a mixed material of an organic compound and a metal oxide, a conductive high molecular compound, or the like can be given.

REFERENCE

[Patent Document 1] Japanese Published Patent Application No. 2008-234885

SUMMARY OF THE INVENTION

An object of one embodiment of the present invention is to suppress occurrence of a crosstalk phenomenon in a light-emitting device including a tandem element.

One embodiment of the present invention is a light-emitting device including: a first electrode and a second electrode over an insulating layer; a partition which is formed over the insulating layer and positioned between the first electrode and the second electrode; a projecting object formed over the partition; a first light-emitting unit over each of the first electrode, the partition, the projecting object, and the second electrode; an intermediate layer over the first light-emitting unit; a second light-emitting unit over the intermediate layer; and a third electrode over the second light-emitting unit. A recess is formed by a side surface of the projecting object and a side surface of the partition.

In the above embodiment of the present invention, a space may be formed between the side surface of the projecting object and the partition.

In the embodiment of the present invention, the first light-emitting unit and the intermediate layer may be disconnected at the projecting object.

In the embodiment of the present invention, an end portion of the projecting object may be formed over a surface of the partition which is inclined with respect to a surface on which the partition is formed.

In the embodiment of the present invention, an inflection point of the recess may be formed on the partition.

In the embodiment of the present invention, in the case where a first point is the most protruded point of the projecting object in the direction parallel to the surface on which the partition is formed and a second point is a point of intersection of a surface of the partition with a line which is drawn perpendicular to the surface on which the partition is formed from the first point, the distance between the first point and the second point may be greater than the total thickness of the first light-emitting unit and the intermediate layer which are positioned over the first electrode and may be smaller than or equal to the total thickness of the first light-emitting unit, the intermediate layer, the second light-emitting unit, and the third electrode which are positioned over the first electrode.

In the embodiment of the present invention, in the case where a third point is the point of intersection of a surface of the second light-emitting unit with a line which is drawn perpendicular to the surface on which the partition is formed from the first point that is the most protruded point of the projecting object in the direction parallel to the surface on which the partition is formed, the distance between the first point and the third point may be smaller than the thickness of the third electrode.

In one embodiment of the present invention, the first light-emitting unit may include a carrier-injection layer so that driving voltage can be decreased. In the light-emitting device of one embodiment of the present invention, the carrier-injection layer can be disconnected at the projecting object (hereinafter, also referred to as "spacer"). Accordingly, even when the carrier-injection layer is provided in order to decrease driving voltage, occurrence of a crosstalk phenomenon can be suppressed.

In one embodiment of the present invention, a color filter may be provided over the first electrode and the second electrode, and the color filter may have a first color and a second color so as to overlap with the first electrode and the second electrode, respectively.

Note that a light-emitting device in this specification includes a display device having a light-emitting element in a pixel (or a sub-pixel). A light-emitting panel includes a display panel in which pixels each having a light-emitting element are provided adjacently. Note that a light-emitting module includes a light-emitting element, and the light-emitting element has a light-emitting unit including a light-emitting layer.

In accordance with one embodiment of the present invention, occurrence of a crosstalk phenomenon can be suppressed in a light-emitting device including a tandem element.

DETAILED DESCRIPTION OF THE INVENTION

Embodiments of the present invention are described in detail below with reference to drawings. Note that the present invention is not limited to the following description, and it is easily understood by those skilled in the art that various changes and modifications can be made without departing from the spirit and scope of the present invention. Therefore, the present invention should not be construed as being limited to the description in the following embodiments.

Embodiment 1

Structure of Display Panel

Figure 1A:
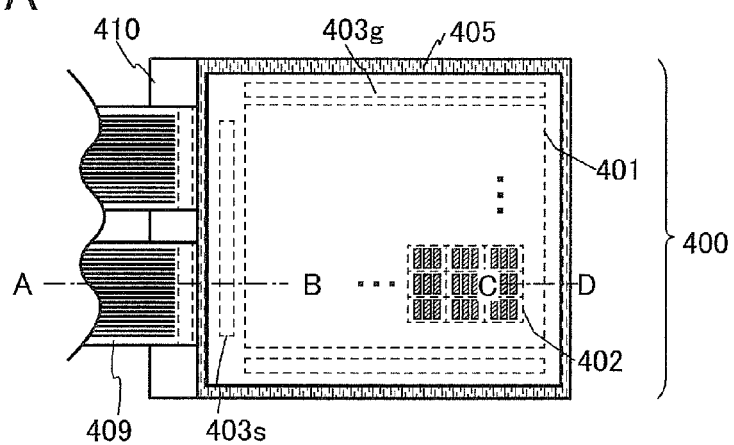
FIG. 1A is a top view of a structure of a display panel which can be used for a display device in one embodiment of the present invention.
Figure 1B:
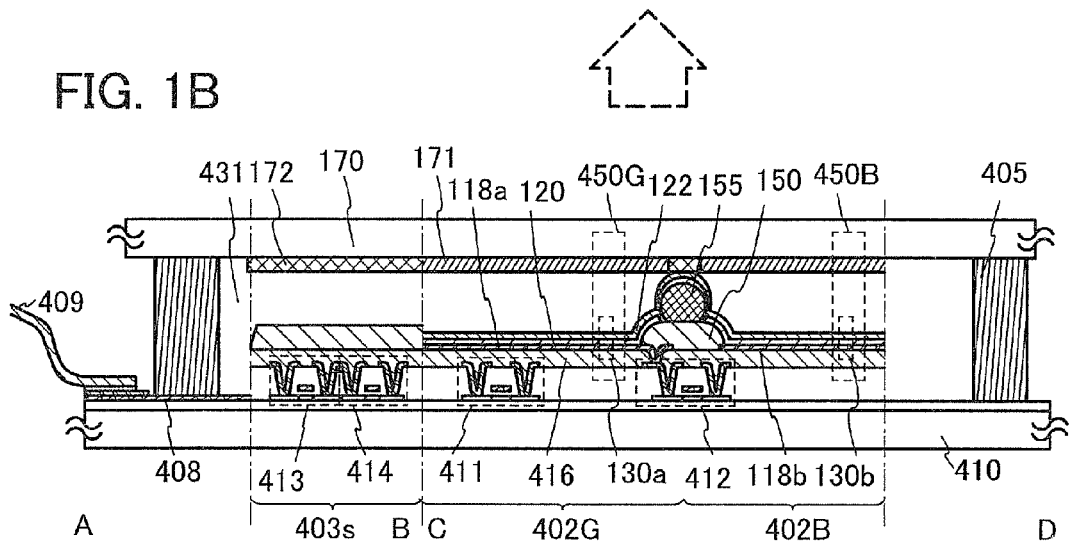
FIG. 1B is a side view of the structure including cross sections along section lines A-B and C-D in FIG. 1A.

FIGS. 1A and 1B illustrate a structure of a display panel which can be used for a display device in one embodiment of the present invention. FIG. 1A is a top view of the structure of the display panel which can be used for a display device in one embodiment of the present invention, and FIG. 1B is a side view of the structure including cross sections along section lines A-B and C-D in FIG. 1A.

A display panel 400 shown as an example in this embodiment includes a display portion 401 over a first substrate 410. The display portion 401 includes a plurality of pixels 402. The pixel 402 includes a plurality of sub-pixels (e.g., three sub-pixels) (see FIG. 1A). Over the first substrate 410, in addition to the display portion 401, a source side driver circuit portion 403s and a gate side driver circuit portion 403g which drive the display portion 401 are provided. Note that the driver circuit portions can be provided not over the first substrate 410 but externally.

The display panel 400 includes an external input terminal and receives a video signal, a clock signal, a start signal, a reset signal, and the like from a flexible printed circuit (FPC) 409.

A sealant 405 bonds the first substrate 410 and a second substrate (hereinafter also referred to as "counter substrate") 170. The display portion 401 is sealed in a space 431 formed between the substrates (see FIG. 1B).

The structure including the cross sections of the display panel 400 is described with reference to FIG. 1B. The display panel 400 includes the source side driver circuit portion 403s, a sub-pixel 402G and a sub-pixel 402B included in the pixel 402, and a lead wiring 408. Note that the display portion 401 of the display panel 400 shown as an example in this embodiment emits light in the direction denoted by the arrow in the drawing, thereby displaying images.

The source side driver circuit portion 403s includes a CMOS circuit which is a combination of an n-channel transistor 413 and a p-channel transistor 414. Note that the driver circuit is not limited to this structure and may be various circuits, such as a CMOS circuit, a PMOS circuit, or an NMOS circuit.

The lead wiring 408 transmits a signal inputted from the external input terminal to the source side driver circuit portion 403s and the gate side driver circuit portion 403g.

The sub-pixel 402G includes a switching transistor 411, a current control transistor 412, and a light-emitting module 450G. Note that an insulating layer 416 and a partition 150 are formed over the transistor 411 and the like. The light-emitting module 450G includes a light-emitting element 130a having a first electrode (hereinafter also referred to as "first lower electrode") 118a, a third electrode (hereinafter also referred to as "upper electrode") 122, and an organic layer 120 between the first lower electrode 118a and the upper electrode 122. Similarly, a light-emitting module 450B included in the sub-pixel 402B includes a light-emitting element 130b having a second electrode (hereinafter also referred to as "second lower electrode") 118b, the upper electrode 122, and the organic layer 120 between the second lower electrode 118b and the upper electrode 122. A color filter 171 is provided on the upper electrode 122 side through which light emitted from the light-emitting elements 130a and 130b is extracted. Note that a direction of an image displayed in the display portion 401 is determined in accordance with a direction in which light emitted from the light-emitting elements 130a and 130b is extracted.

Note that it is acceptable as long as at least one of the lower electrode and the upper electrode in the light-emitting element transmits light emitted from the organic layer 120. For example, FIG. 1B illustrates the structure in which the upper electrode 122 transmits light emitted from the organic layer 120.

In addition, a light-blocking film (hereinafter also referred to as "black matrix") 172 is formed so as to surround the color filter 171. A black matrix 172 prevents a phenomenon in which the display panel 400 reflects outside light, and has an effect of increasing the contrast of images displayed in the display portion 401. Note that the color filter 171 and the black matrix 172 are formed over the counter substrate 170.

The insulating layer 416 is a layer having insulating properties for planarizing a step due to the structure of the transistor 411 and the like or for suppressing impurity diffusion into the transistor 411 and the like. The insulating layer 416 can be a single layer or a stacked layer. The partition 150 is an insulating layer having an opening; the light-emitting elements 130a and 130b are formed in the opening of the partition 150.

<Structure of Transistor>

Top-gate transistors are used in the display panel 400 shown as an example in FIG. 1A. However, the present invention is not limited to this example, and bottom-gate transistors may be used. Various types of transistors can be used for the source side driver circuit portion 403s, the gate side driver circuit portion 403g, and the sup-pixels. Note that various semiconductors can be used for regions where channels of these transistors are formed. Specifically, as well as amorphous silicon, polysilicon, or single crystal silicon, an oxide semiconductor or the like can be used. As an example of an oxide semiconductor, an oxide semiconductor containing at least indium (In) or zinc (Zn) can be given, and an oxide semiconductor containing In and Zn is preferable. An oxide semiconductor containing gallium (Ga) or tin (Sn) or both is particularly preferable.

When a single crystal semiconductor is used for a region where a channel of a transistor is formed, the size of the transistor can be reduced, which results in even higher resolution pixels in a display portion.

As a single crystal semiconductor used for forming a semiconductor layer, a semiconductor substrate, such as a single crystal silicon substrate, or a silicon on insulator (SOI) substrate in which a single crystal semiconductor layer is provided on an insulating surface can be used.

<Configuration of Pixel>

A configuration of the pixel 402 included in the display portion 401 is described with reference to FIGS. 2A and 2B and FIGS. 3A and 3B.

Figure 2A:
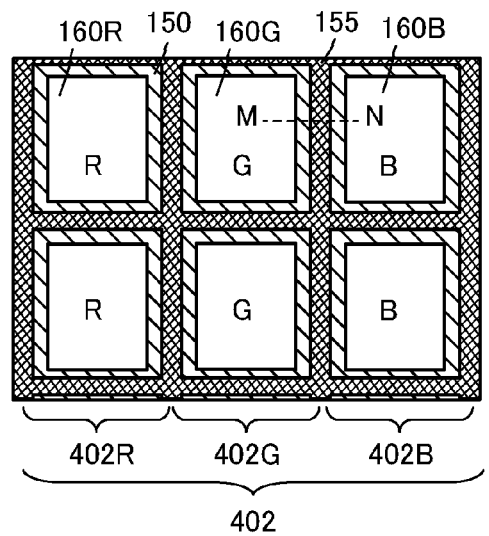
FIG. 2A is a top view of pixels.
Figure 2B:
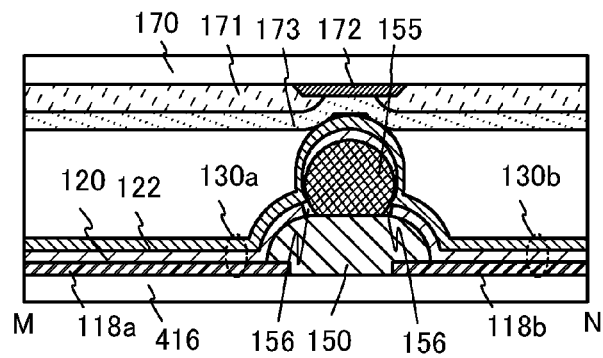
FIG. 2B is a cross-sectional view along dashed line M-N in FIG. 2A.

FIGS. 2A to 2D illustrate examples of positional relationship between the partition 150, a spacer (projecting object) 155, and light-emitting portions 160R, 160G, and 160B. FIG. 2A is a top view of the pixels 402, and FIG. 2B is an example of a cross-sectional view along dashed line M-N in FIG. 2A. FIGS. 3A and 3B are each an example of an enlarged cross-sectional view of the partition, the spacer, and the light-emitting element 130b illustrated in FIG. 2B. Note that the illustration of the organic layer 120, the upper electrode 122, an overcoat layer 173, the color filter 171, the black matrix 172, and the counter substrate 170 is omitted in FIG. 2A.

The pixel 402 shown as an example in this embodiment includes a sub-pixel 402R emitting red light R, the sub-pixel 402G emitting green light G, and the sub-pixel 402B emitting blue light B. The sub-pixel 402R includes a red light-emitting portion 160R, the sub-pixel 402G includes a green light-emitting portion 160G, and the sub-pixel 402B includes a blue light-emitting portion 160B. The red light-emitting portion 160R, the green light-emitting portion 160G, and the blue light-emitting portion 160B are provided in respective openings in the partition 150 (see FIG. 2A).

Each of the light-emitting portions 160R, 160G, and 160B includes a light-emitting element including a lower electrode, an organic layer, and the upper electrode 122. For example, the green light-emitting portion 160G includes the light-emitting element 130a including the first lower electrode 118a, the organic layer 120, and the upper electrode 122, and the blue light-emitting portion 160B includes the light-emitting element 130b including a second lower electrode 118b, the organic layer 120, and the upper electrode 122 (see FIG. 2B). The organic layer 120 includes a first light-emitting unit 141, an intermediate layer 142, and a second light-emitting unit 143 (see FIG. 3A). The counter substrate 170 is provided with the color filter 171 overlapping with the light-emitting portion, the black matrix 172 overlapping with the partition 150, and the overcoat layer 173 covering the color filter 171 and the black matrix 172 (see FIG. 2B). The overcoat layer 173 is not necessarily provided when not needed.

Each of the light-emitting portions 160R, 160G, and 160B includes the light-emitting element including the lower electrode, the upper electrode 122, and the organic layer 120 including the first light-emitting unit 141, the intermediate layer 142, and the second light-emitting unit 143. The conductivity of the intermediate layer 142 is higher than that of the first light-emitting unit 141.

The sub-pixel 402G includes a driver transistor and the light-emitting module 450G. The other sub-pixels 402R and 402B also have a structure similar to that of the sub-pixel 402G. Each light-emitting module includes the light-emitting element including the lower electrode, the upper electrode 122, and the organic layer 120 between the lower electrode and the upper electrode 122 (see FIG. 1B).

The light-emitting element has a structure in which the organic layer 120 including the first light-emitting unit 141, the intermediate layer 142, and the second light-emitting unit 143 is provided between the lower electrode and the upper electrode.

Note that it is acceptable as long as at least one of the lower electrode and the upper electrode in the light-emitting element transmits light emitted from the organic layer. For example, a reflective film may be used for the first and second lower electrodes 118a and 118b, and a semi-transmissive and semi-reflective film may be used for the upper electrode 122. When a microresonator is formed by making an overlap between the reflective film and the semi-transmissive and semi-reflective film and the organic layer 120 is formed therebetween, light with a specific wavelength can be efficiently extracted from the semi-transmissive and semi-reflective film (upper electrode 122) side. The wavelength of extracted light depends on the distance between the reflective film and the semi-transmissive and semi-reflective film, and the distance can be adjusted by forming an optical adjustment layer between the reflective film and the semi-transmissive and semi-reflective film.

A conductive film having light-transmitting properties with respect to visible light or a layer containing a light-emitting organic compound can be employed for a material that can be used for the optical adjustment layer. For example, the thickness of a charge-generation region may be adjusted so that the charge-generation region also serves as the optical adjustment layer. Alternatively, the thickness of a region (mixed material layer) containing a substance having a high hole-transport property and a substance exhibiting an acceptor property with respect to the substance having a high hole-transport property may be adjusted so that the mixed material layer also serves as the optical adjustment layer. This is preferably used because an increase in driving voltage can be suppressed even when the optical adjustment layer is thick.

Note that the structural example of the light-emitting element is described in detail in Embodiment 2.

The light-emitting module 450G shown as an example in this embodiment has a structure in which the upper electrode 122 of the light-emitting element provided in the light-emitting module also serves as a semi-transmissive and semi-reflective film. In more detail, the upper electrode 122 shared by the light-emitting elements also serves as a semi-transmissive and semi-reflective film of each light-emitting module.

In addition, the lower electrode of the light-emitting element is provided in an electrically separate manner in each light-emitting module, and the lower electrode also serves as a reflective film of the light-emitting module.

The lower electrode also serving as a reflective film of each light-emitting module has a stacked-layer structure in which an optical adjustment layer is stacked over the reflective film. The optical adjustment layer is preferably formed of a conductive film having light-transmitting properties with respect to visible light, and the reflective film is preferably formed of a conductive metal film having high reflectivity with respect to visible light.

The thickness of the optical adjustment layer is adjusted in accordance with a wavelength of light extracted from a light-emitting module. Specific description is given below.

For example, the light-emitting module (blue) includes a color filter which transmits blue light, the lower electrode also serving as a reflective film, and the upper electrode also serving as a semi-transmissive and semi-reflective film; the optical path length between the lower electrode and the upper electrode is adjusted to intensify light having a wavelength greater than or equal to 400 nm and less than 500 nm.

Further, the light-emitting module 450G includes a color filter which transmits green light, a reflective film, and a semi-transmissive and semi-reflective film; the optical path length between the reflective film and the semi-transmissive and semi-reflective film is adjusted to intensify light having a wavelength greater than or equal to 500 nm and less than 600 nm.

Further, the light-emitting module (red) includes a color filter which transmits red light, a reflective film, and a semi-transmissive and semi-reflective film; the optical path length between the reflective film and the semi-transmissive and semi-reflective film is adjusted to intensify light having a wavelength greater than or equal to 600 nm and less than 800 nm.

In such a light-emitting module, interference of light emitted from the light-emitting elements occurs between the reflective film and the semi-transmissive and semi-reflective film, light having a specific wavelength in the range of greater than or equal to 400 nm and less than 800 nm is intensified, and unnecessary light is absorbed by the color filter.

Note that each light-emitting module includes the organic layer 120 including the first light-emitting unit 141, the intermediate layer 142, and the second light-emitting unit 143. In addition, one of the pair of electrodes (lower and upper electrodes) of each light-emitting element also serves as a reflective film and the other thereof also serves as a semi-transmissive and semi-reflective film.

In the light-emitting modules with such a structure, light-emitting units can be formed in the same process.

<Structures of Partition and Spacer (Projecting Object)>

The partition 150 is formed at the periphery of the pixels 402, at the periphery of the sub-pixels 402B, 402G, and 402R, and at the periphery of the light-emitting portions 160R, 160G, and 160B (see FIG. 2A).

The partition 150 is provided between the first lower electrode 118a and the second lower electrode 118b to cover an end portion of each of the first lower electrode 118a and the second lower electrode 118b. The spacer 155 is formed over the partition 150. The spacer 155 may be protruded in the direction parallel to a surface on which the partition 150 is formed, and a recess may be formed by a side surface of the spacer 155 and a side surface of the partition 150. In other words, the spacer 155 may be formed on an outer surface of the partition 150 and may have a projecting shape, and the recess may be formed by the side surface of the spacer 155 and the side surface of the partition 150. With such a structure, a space (void) 156 is preferably formed between the side surface of the spacer 155 and the partition 150. As materials for the partition 150 and the spacer 155, a negative photosensitive resin or a positive photosensitive resin can be used (see FIG. 2B).

As illustrated in FIG. 3A, a point that is the most protruded point of the spacer 155 in the direction parallel to the surface on which the partition is formed is referred to as a first point X; the point of intersection of a surface of the partition 150 with a line which is drawn from the first point X perpendicular to the surface on which the partition 150 is formed or a surface of the substrate is referred to as a second point Y1; and the distance between the first point X and the second point Y1 is referred to as a height L1 of the recess. In this case, the height L1 of the recess may be greater than the total thickness A1 of the first light-emitting unit 141 and the intermediate layer 142 which are positioned over the second lower electrode 118b and may be smaller than or equal to the total thickness A2 of the first light-emitting unit 141, the intermediate layer 142, the second light-emitting unit 143, and the upper electrode 122 which are positioned over the second lower electrode 118b. Accordingly, the first light-emitting unit 141 and the intermediate layer 142 having high conductivity can be disconnected at the side surface of the spacer 155, and the upper electrode 122 can be prevented from being disconnected. The space (void) 156 exists on the inner side of the line connecting the first point X and the second point Y1.

Figure 6:
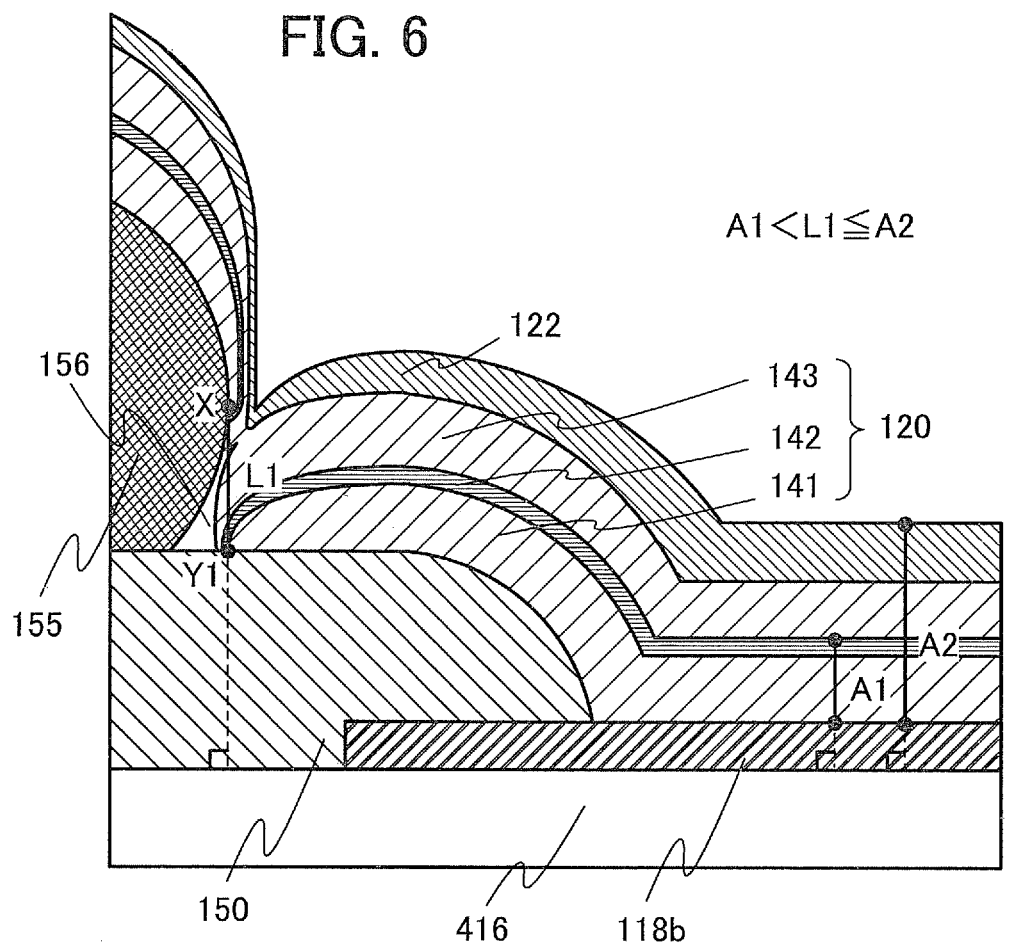
FIG. 6 is a cross-sectional view illustrating a modified example of FIG. 3A.

Here, when the upper electrode 122 partly has a small thickness due to formation of the spacer 155, a problem such as luminance unevenness of display might occur because of light-emission defects caused by a potential drop due to the resistance of the upper electrode 122. Thus, as illustrated in FIG. 6, it is preferable that the upper electrode 122 be not disconnected and be prevented from being reduced in thickness by preventing the second light-emitting unit 143 from being disconnected.

As illustrated in FIG. 3B, the point that is the most protruded point of the spacer 155 in the direction parallel to the surface on which the partition is formed is referred to as the first point X; the point of intersection of a surface of the second light-emitting unit 143 with a line which is drawn from the first point X perpendicular to the surface on which the partition 150 is formed or the surface of the substrate is referred to as a third point Y2; and the distance between the first point X and the third point Y2 is referred to as a distance L2. In this case, the distance L2 may be smaller than the thickness A3 of the upper electrode 122. Accordingly, the upper electrode 122 can be prevented from being disconnected even when all the layers included in the organic layer 120 are disconnected. Note that the thicknesses A1, A2, and A3 each correspond to a thickness on a perpendicular line drawn from a surface of each layer to a surface on which the second lower electrode 118b is formed or the surface of the substrate.

One example of an organic EL element of one embodiment of the present invention is given below.

Thickness of the first light-emitting unit 141: approximately 75 nm (30 nm to 200 nm)

Thickness of the intermediate layer 142: approximately 30 nm (1 nm to 100 nm)

Thickness of the second light-emitting unit 143: approximately 90 nm (30 nm to 200 nm)

The upper electrode 122 (transparent electrode or reflective electrode): a stack of 15-nm-thick MgAg and 70-nm-thick indium tin oxide (ITO) (total thickness: 5 nm to 200 nm)

Figure 2C:
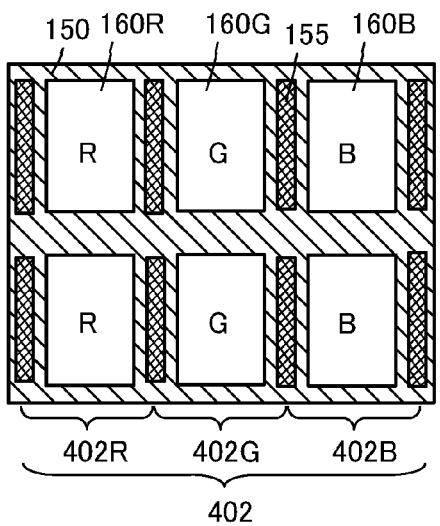
FIG. 2C is a top view of pixels in a modified example of FIG. 2A.
Figure 2D:
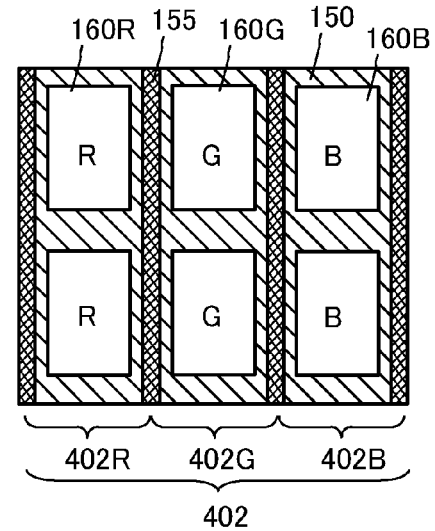
FIG. 2D is a top view of pixels in a modified example of FIG. 2A.
Figure 3A:
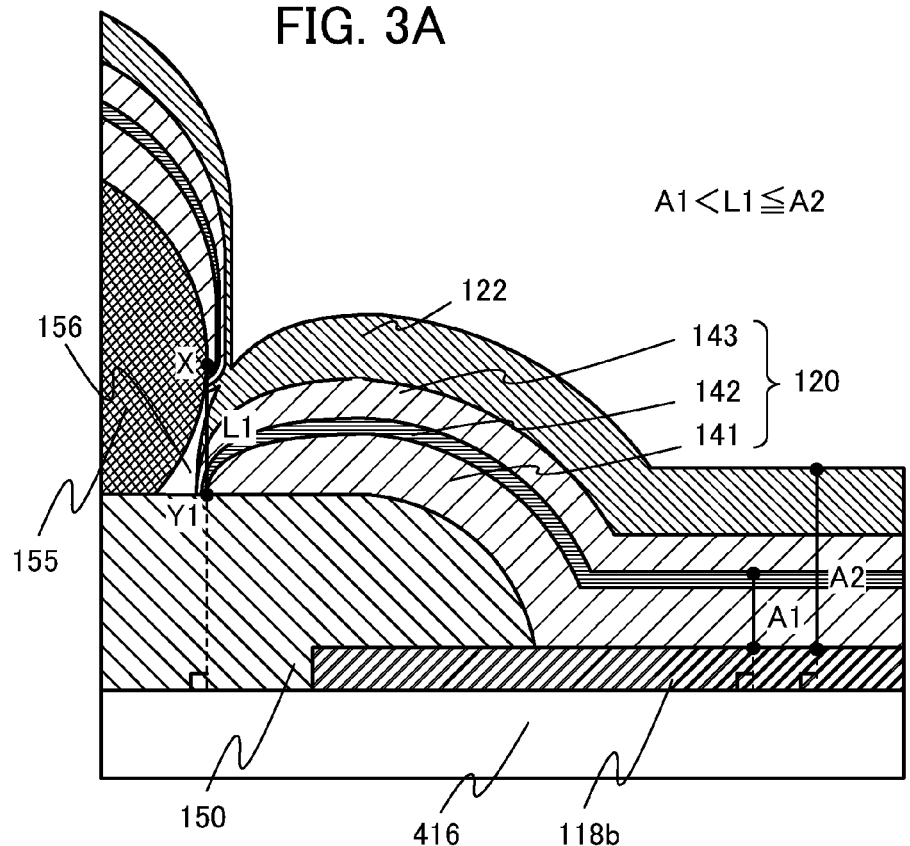
FIGS. 3A and 3B are each an enlarged cross-sectional view of a partition, a spacer, and a light-emitting element illustrated in FIG. 2B.
Figure 3B:
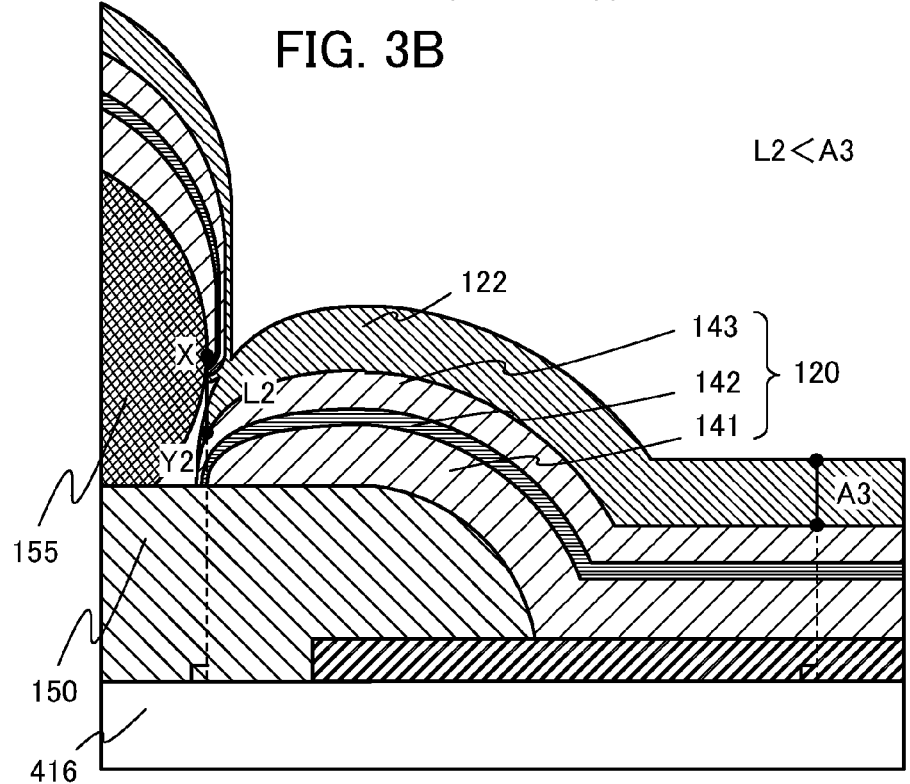

The layout of the spacer 155 is not limited to that illustrated in FIG. 2A, and may be the layout illustrated in FIG. 2C or 2D. In FIG. 2A, the spacer 155 is provided between all adjacent light-emitting portions. In FIGS. 2C and 2D, the spacer 155 is provided between adjacent light-emitting portions which exhibit different colors, and is not provided between adjacent light-emitting portions which exhibit the same color. That is, it is acceptable as long as the spacer 155 is provided at least between adjacent light-emitting portions which exhibit different colors. Accordingly, the first light-emitting unit 141 and the intermediate layer 142 can be disconnected at the spacer 155 between adjacent light-emitting portions which exhibit different colors.

Figure 4A:
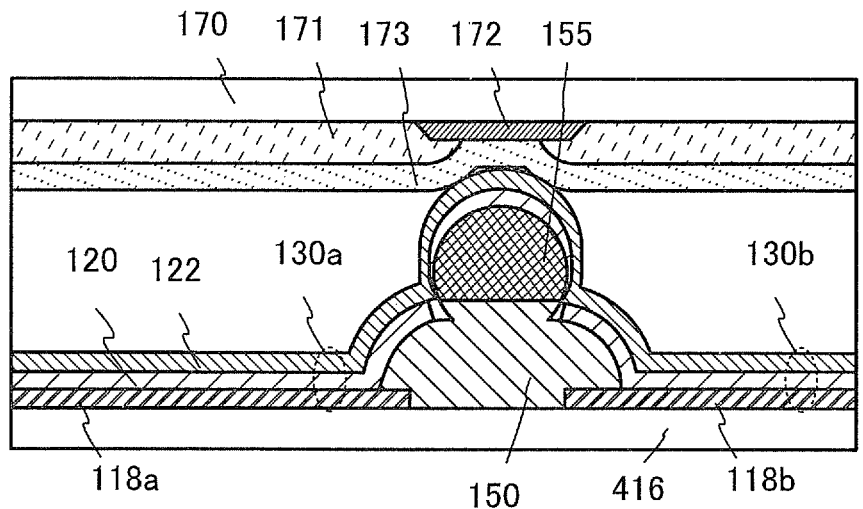
FIGS. 4A and 4B are cross-sectional views each illustrating a modified example of FIG. 2B.

The shape of the recess formed by the spacer 155 and the partition 150 is not limited to that illustrated in FIG. 2B, and the shape illustrated in FIG. 4A is preferable. In FIG. 2B, an inflection point of the recess is formed at a contact surface between the partition 150 and the spacer 155. In FIG. 4A, the inflection point of the recess is formed on the partition 150. In other words, the spacer 155 may be formed on the outer surface of the partition 150 and have a projecting shape, and the inflection point of the recess be formed on the side surface of the partition 150. The inflection point of the recess can be formed on the partition 150 by etching the partition 150 using the spacer 155 as a mask at the time of forming the spacer 155. Accordingly, the height L1 of the recess can be increased.

Figure 4B:
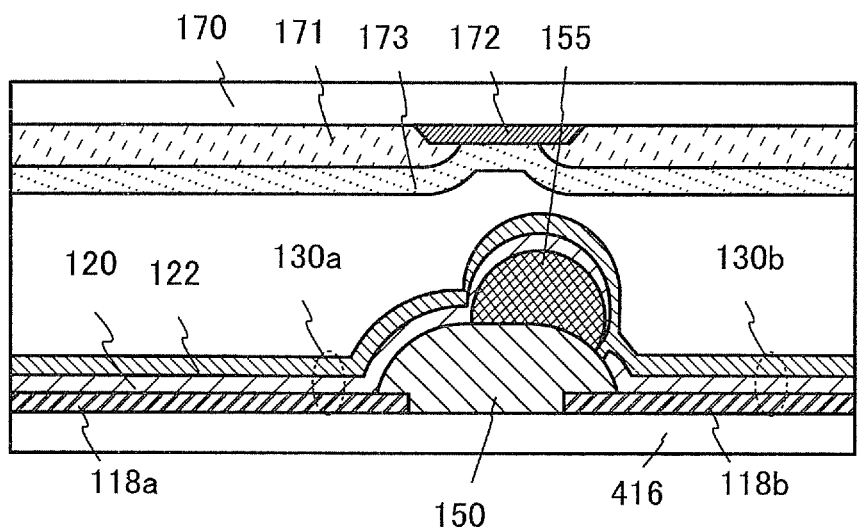

The position of the spacer 155 is not limited to that illustrated in FIG. 2B, and the position illustrated in FIG. 4B is preferable. In FIG. 2B, an end portion of the spacer 155 is provided over a flat surface portion of the partition 150 (that is, a region having a surface substantially parallel to the surface on which the partition 150 is formed). In FIG. 4B, the end portion of the spacer 155 is formed over an inclined surface portion of the partition 150 (that is, a region including a surface which is inclined with respect to or not parallel to the surface on which the partition 150 is formed), which is preferable. By positioning the spacer 155 such that the end portion of the spacer 155 is over the inclined portion of the surface of the partition 150, the height L1 of the recess can be increased.

Note that FIG. 2B and FIGS. 4A and 4B each illustrate an example of the case where the organic layer 120 is disconnected and the upper electrode 122 is not disconnected between adjacent light-emitting portions. In FIGS. 2C and 2D, the illustration of the organic layer 120, the upper electrode 122, the overcoat layer 173, the color filter 171, the black matrix 172, and the counter substrate 170 is omitted, and an opening in the partition 150 corresponds to a light-emitting portion (the red light-emitting portion 160R, the green light-emitting portion 160G, or the blue light-emitting portion 160B).

In accordance with this embodiment, the first light-emitting unit 141 is disconnected at the recess formed by the spacer 155 and the partition 150, whereby a highly conductive layer (such as a carrier-injection layer) included in the first light-emitting unit 141 can also be disconnected. Accordingly, the electrical continuity of the highly conductive layer is lost and continuous current flow is suppressed. Thus, occurrence of a crosstalk phenomenon between adjacent pixels or sub-pixels which emit light of different colors can be suppressed.

In addition, the intermediate layer 142 is disconnected at the recess formed by the spacer 155 and the partition 150, whereby the electrical continuity of the intermediate layer 142 is lost and continuous current flow is suppressed. Thus, occurrence of a crosstalk phenomenon between adjacent pixels or sub-pixels which emit light of different colors can be suppressed.

Furthermore, since the upper electrode 122 is not disconnected, the potential of the upper electrode 122 is uniform in adjacent pixels, and the upper electrode 122 has a uniform potential in terms of a plane, and preferably the entire upper electrode 122 has a uniform potential. Thus, there is an effect of suppressing a voltage decrease or the like.

In addition, in a structure that displays images by extracting light emitted from the light-emitting module from the first substrate 410 side which is provided with a semi-transmissive and semi-reflective film, the partition 150 formed using a material absorbing visible light absorbs outside light which is reflected by the semi-transmissive and semi-reflective film on the first substrate 410, thereby suppressing the reflection.

<Sealing Structure>

The display panel 400 shown as an example in this embodiment has a structure in which the light-emitting element is sealed in the space 431 enclosed by the first substrate 410, the second substrate 170, and the sealant 405 (see FIGS. 1A and 1B).

The space 431 can be filled with an inert gas (e.g., nitrogen or argon) or resin. An absorbent for impurities (typically, water and/or oxygen) such as a dry agent may be provided in the space 431.

The sealant 405 and the second substrate 170 are desirably formed using a material which does not transmit impurities in the air (typically, water and/or oxygen) as much as possible. An epoxy-based resin, glass frit, or the like can be used for the sealant 405.

Examples of the second substrate 170 include a glass substrate; a quartz substrate; a plastic substrate formed of polyvinyl fluoride (PVF), polyester, an acrylic resin, or the like; a substrate of fiberglass-reinforced plastics (FRP); and the like.

<Method for Manufacturing Light-Emitting Device>

A method for manufacturing a light-emitting device of one embodiment of the present invention is described with reference to FIG. 2B and FIGS. 3A and 3B.

An electrode layer is formed over the insulating layer 416, a photoresist film (not illustrated) is formed over the electrode layer, and the photoresist film is exposed to light and developed, whereby a resist mask is formed over the electrode layer. Next, the electrode layer is etched using this resist mask as a mask, so that the first lower electrode 118a and the second lower electrode 118b are formed over the insulating layer 416 (see FIG. 2B).

Next, the partition 150 is formed over the insulating layer 416 and the end portion of each of the first lower electrode 118a and the second lower electrode 118b. Then, a positive photosensitive material film is applied over the partition 150, the first lower electrode 118a, and the second lower electrode 118b, and this positive photosensitive material film is exposed to light and developed, whereby the spacer 155 is formed over the partition 150. The spacer 155 is protruded in the direction parallel to the surface on which the partition 150 is formed, and the recess is formed by the side surface of the spacer 155 and the side surface of the partition 150.

Next, the first light-emitting unit 141 is formed over the first lower electrode 118a, the second lower electrode 118b, the partition 150, and the spacer 155 by an evaporation method, and the intermediate layer 142 is formed over the first light-emitting unit 141 by an evaporation method. The conductivity of the intermediate layer 142 is higher than that of the second light-emitting unit 143. Then, the second light-emitting unit 143 is formed over the intermediate layer 142 by an evaporation method, and the upper electrode 122 is formed over the second light-emitting unit 143.

The height L1 of the recess formed by the side surface of the spacer 155 and the side surface of the partition 150 is greater than the total thickness A1 of the first light-emitting unit 141 and the intermediate layer 142 which are positioned over the second lower electrode 118b and is smaller than or equal to the total thickness A2 of the first light-emitting unit 141, the intermediate layer 142, the second light-emitting unit 143, and the upper electrode 122 which are positioned over the second lower electrode 118b. Accordingly, at the recess, the first light-emitting unit 141, the intermediate layer 142 having high conductivity, and the second light-emitting unit 143 are disconnected, and the upper electrode 122 is not disconnected (see FIG. 3A).

Next, the color filter 171 is provided near or in contact with the upper electrode 122 over the partition, and a light-emitting element, together with an inert gas or a resin, is sealed with a sealant. The color filter 171 includes a green color filter overlapping with the first lower electrode 118a and a blue color filter overlapping with the second lower electrode 118b, and the light-blocking film 172 is formed between the blue color filter and the green color filter (see FIG. 2B).

Embodiment 2

A configuration example of a light-emitting element which can be used in a light-emitting module of one embodiment of the present invention is described with reference to FIGS. 5A to 5C.

The light-emitting element shown as an example in this embodiment includes a lower electrode, an upper electrode, and an organic layer between the lower electrode and the upper electrode. One of the lower and upper electrodes functions as an anode, and the other functions as a cathode. The organic layer is provided between the lower electrode and the upper electrode, and a structure of the organic layer may be appropriately determined in accordance with materials of the lower electrode and the upper electrode.

Configuration Example of Light-Emitting Element

Figure 5A:
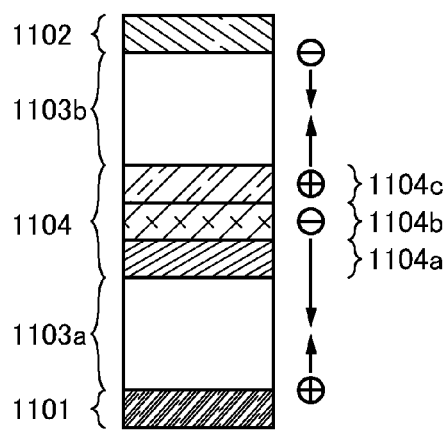
FIG. 5A illustrates a structure of a tandem light-emitting element in which two light-emitting units are stacked.

An example of a configuration of the light-emitting element is illustrated in FIG. 5A. In the light-emitting element illustrated in FIG. 5A, an organic layer including a light-emitting unit 1103a and a light-emitting unit 1103b is provided between an anode 1101 and a cathode 1102. Furthermore, an intermediate layer 1104 is provided between the light-emitting unit 1103a and the light-emitting unit 1103b.

When a voltage higher than the threshold voltage of the light-emitting element is applied between the anode 1101 and the cathode 1102, holes are injected to the organic layer from the anode 1101 side and electrons are injected to the organic layer from the cathode 1102 side. The injected electrons and holes are recombined in the organic layer, so that a light-emitting substance contained in the organic layer emits light.

The number of light-emitting units provided between the anode 1101 and the cathode 1102 is not limited to two. A light-emitting element illustrated in FIG. 5C has what is called a tandem structure, that is, a structure in which a plurality of light-emitting units 1103 is stacked. Note that in the case where n (n is a natural number greater than or equal to 2) light-emitting units 1103 are provided between the anode and the cathode, for example, the intermediate layer 1104 is provided between an m-th light-emitting unit and an (m+1)-th light-emitting unit.

The light-emitting unit 1103 includes at least one light-emitting layer containing a light-emitting substance, and may have a structure in which the light-emitting layer and a layer other than the light-emitting layer are stacked. Examples of the layer other than the light-emitting layer are layers which contain a substance having a high hole-injection property, a substance having a high hole-transport property, a substance having a poor hole-transport property (substance which blocks holes), a substance having a high electron-transport property, a substance having a high electron-injection property, a substance having a bipolar property (substance having high electron- and hole-transport properties), and the like. In particular, the layer which contains a substance having a high hole-injection property and is provided in contact with the anode and the layer which contains a substance having a high electron-injection property and is provided in contact with the cathode serve to lower a barrier against carrier injection from the electrodes to the light-emitting unit. These layers can be each referred to as a carrier-injection layer.

Figure 5B:
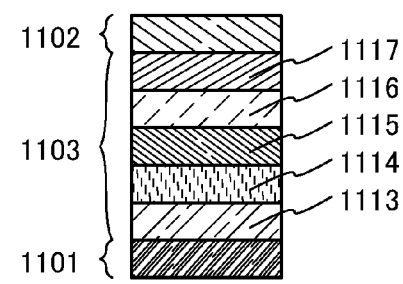
FIG. 5B illustrates an example of a specific structure of a light-emitting unit.
Figure 5C:
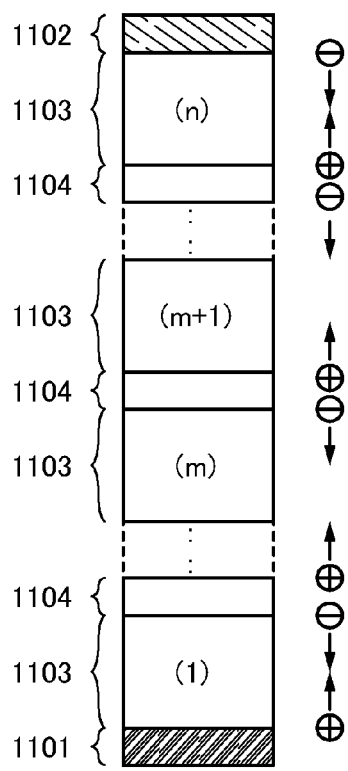
FIG. 5C illustrates a structure of a tandem light-emitting element in which a plurality of light-emitting units is stacked.

An example of a specific configuration of the light-emitting unit 1103 is illustrated in FIG. 5B. In the light-emitting unit 1103 illustrated in FIG. 5B, a hole-injection layer 1113, a hole-transport layer 1114, a light-emitting layer 1115, an electron-transport layer 1116, and an electron-injection layer 1117 are stacked in this order from the anode 1101 side.

An example of a specific structure of the intermediate layer 1104 is illustrated in FIG. 5A. The intermediate layer 1104 may be formed to include at least a charge-generation region, and may have a structure in which the charge-generation region and a layer other than the charge-generation region are stacked. For example, a structure can be employed in which a first charge-generation region 1104c, an electron-relay layer 1104b, and an electron-injection buffer layer 1104a are stacked in this order from the cathode 1102 side.

The behaviors of electrons and holes in the intermediate layer 1104 are described. When a voltage higher than the threshold voltage of the light-emitting element is applied between the anode 1101 and the cathode 1102, in the first charge-generation region 1104c, holes and electrons are generated, and the holes move into the light-emitting unit 1103b provided on the cathode 1102 side and the electrons move into the electron-relay layer 1104b.

The electron-relay layer 1104b has a high electron-transport property and immediately transfers the electrons generated in the first charge-generation region 1104c to the electron-injection buffer layer 1104a. The electron-injection buffer layer 1104a can lower a barrier against electron injection into the light-emitting unit 1103a, so that the efficiency of the electron injection into the light-emitting unit 1103a is increased. Thus, the electrons generated in the first charge-generation region 1104c are injected into the lowest unoccupied molecular orbital (hereinafter referred to as "LUMO level") of the light-emitting unit 1103a through the electron-relay layer 1104b and the electron-injection buffer layer 1104a.

In addition, the electron-relay layer 1104b can prevent interaction in which the substance included in the first charge-generation region 1104c and the substance included in the electron-injection buffer layer 1104a react with each other at the interface therebetween and the functions of the first charge-generation region 1104c and the electron-injection buffer layer 1104a are impaired.

The holes injected into the light-emitting unit 1103b provided on the cathode side are recombined with electrons injected from the cathode 1102, so that a light-emitting substance contained in the light-emitting unit 1103b emits light. The electrons injected into the light-emitting unit 1103a provided on the anode side are recombined with holes injected from the anode side, so that a light-emitting substance contained in the light-emitting unit 1103a emits light. Thus, the holes and electrons generated in the intermediate layer 1104 cause light emission in different light-emitting units.

Note that the light-emitting units can be provided in contact with each other when these light-emitting units allow the same structure as the intermediate layer to be formed therebetween. Specifically, when one surface of the light-emitting unit is provided with a charge-generation region, the charge-generation region functions as a first charge-generation region of the intermediate layer; thus, the light-emitting units can be provided in contact with each other.

Note that an intermediate layer may be provided between the cathode and the n-th light-emitting unit.

<Material for Light-Emitting Element>

Next, specific materials that can be used for the light-emitting element having the above-described structure are described. Materials for the anode, the cathode, the organic layer, the charge-generation region, the electron-relay layer, and the electron-injection buffer layer are described in this order.

<Material for Anode>

The anode 1101 is preferably formed using a metal, an alloy, an electrically conductive compound, a mixture of these materials, or the like which has a high work function (specifically, a work function of higher than or equal to 4.0 eV is more preferable). Specifically, for example, indium tin oxide (ITO), indium tin oxide containing silicon or silicon oxide, indium zinc oxide (IZO), indium oxide containing tungsten oxide and zinc oxide, and the like are given.

Besides, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like.

Note that in the case where a second charge-generation region is provided in contact with the anode 1101, a variety of conductive materials can be used for the anode 1101 regardless of their work functions. Specifically, besides a material which has a high work function, a material which has a low work function can also be used for the anode 1101. A material for forming the second charge-generation region is subsequently described together with a material for forming the first charge-generation region.

<Material for Cathode>

As a material of the cathode 1102, a material having a low work function (specifically, a work function of lower than 4.0 eV) is preferably used; however, in the case where the first charge-generation region is provided between the cathode 1102 and the light-emitting unit 1103 to be in contact with the cathode 1102, various conductive materials can be used for the cathode 1102 regardless of their work functions.

Note that at least one of the cathode 1102 and the anode 1101 is formed using a conductive film that transmits visible light. For the conductive film that transmits visible light, for example, a film of indium oxide containing tungsten oxide, indium zinc oxide containing tungsten oxide, indium oxide containing titanium oxide, indium tin oxide containing titanium oxide, indium tin oxide, indium zinc oxide, and indium tin oxide to which silicon oxide is added can be given. Further, a metal thin film having a thickness small enough to transmit light (preferably, approximately 5 nm to 30 nm) can also be used.

<Material for Organic Layer>

Specific examples of materials for the layers included in the light-emitting unit 1103 are given below.

<Hole-Injection Layer>

The hole-injection layer contains a substance having a high hole-injection property. As the substance having a high hole-injection property, for example, molybdenum oxide, vanadium oxide, ruthenium oxide, tungsten oxide, manganese oxide, or the like can be used. In addition, it is possible to use a phthalocyanine-based compound such as phthalocyanine (abbreviation: H$_2$Pc) or copper phthalocyanine (abbreviation: CuPc), a polymer such as poly(3,4-ethylenedioxythiophene)/poly(styrenesulfonate) (PEDOT/PSS), or the like to form the hole-injection layer.

Note that the second charge-generation region may be used instead of the hole-injection layer. When the second charge-generation region is used, a variety of conductive materials can be used for the anode 1101 regardless of their work functions as described above. A material for forming the second charge-generation region is subsequently described together with a material for forming the first charge-generation region.

<Hole-Transport Layer>

The hole-transport layer contains a substance having a high hole-transport property. The hole-transport layer is not limited to a single layer, and may be a stack of two or more layers each containing a substance having a high hole-transport property. The hole-transport layer contains any substance having a higher hole-transport property than an electron-transport property, and preferably contains a substance having a hole mobility of $10^{-6}$ cm$^2$/Vs or higher because the driving voltage of the light-emitting element can be reduced.

<Light-Emitting Layer>

The light-emitting layer contains a light-emitting substance. The light-emitting layer is not limited to a single layer, and may be a stack of two or more layers each containing a light-emitting substance. As the light-emitting substance, a fluorescent compound or a phosphorescent compound can be used. A phosphorescent compound is preferably used as the light-emitting substance because the emission efficiency of the light-emitting element can be increased.

The light-emitting substance is preferably dispersed in a host material. A host material preferably has higher excitation energy than the light-emitting substance.

<Electron-Transport Layer>

The electron-transport layer contains a substance having a high electron-transport property. The electron-transport layer is not limited to a single layer, and may be a stack of two or more layers each containing a substance having a high electron-transport property. The electron-transport layer contains any substance having a higher electron-transport property than a hole-transport property, and preferably contains a substance having an electron mobility of $10^{-6}$ cm$^2$/Vs or higher because the driving voltage of the light-emitting element can be reduced.

<Electron-Injection Layer>

The electron-injection layer contains a substance having a high electron-injection property. The electron-injection layer is not limited to a single layer, and may be a stack of two or more layers each containing a substance having a high electron-injection property. The electron-injection layer is preferably provided because the efficiency of electron injection from the cathode 1102 can be increased and the driving voltage of the light-emitting element can be reduced.

As the substance having a high electron-injection property, the following can be given: an alkali metal and an alkaline earth metal such as lithium (Li), cesium (Cs), calcium (Ca) and a compound thereof, such as lithium fluoride (LiF), cesium fluoride (CsF), and calcium fluoride (CaF$_2$). Alternatively, a layer containing a substance having an electron-transport property and an alkali metal, an alkaline earth metal, magnesium (Mg), or a compound thereof (e.g., an Alq layer containing magnesium (Mg)) can be used.

<Material for Charge-Generation Region>

The first charge-generation region 1104c and the second charge-generation region are regions containing a substance having a high hole-transport property and an acceptor substance. Note that the charge-generation region is not limited to the structure in which one film contains the substance having a high hole-transport property and the acceptor substance, and may be a stacked layer of a layer containing the substance having a high hole-transport property and a layer containing the acceptor substance. Note that in the case where the first charge-generation region which is in contact with the cathode has a stacked-layer structure, the layer containing the substance having a high hole-transport property is in contact with the cathode 1102. In the case where the second charge-generation region which is in contact with the anode has a stacked-layer structure, the layer containing the acceptor substance is in contact with the anode 1101.

Note that the acceptor substance is preferably added to the charge-generation region so that the mass ratio of the acceptor substance to the substance having a high hole-transport property is from 0.1:1 to 4.0:1.

As the acceptor substance that is used for the charge-generation region, a transition metal oxide, particularly an oxide of a metal belonging to any of Groups 4 to 8 of the periodic table is preferable. Specifically, molybdenum oxide is particularly preferable. Note that molybdenum oxide has a low hygroscopic property.

As the substance having a high hole-transport property used for the charge-generation region, any of a variety of organic compounds such as an aromatic amine compound, a carbazole derivative, an aromatic hydrocarbon, and a high molecular compound (including an oligomer, a dendrimer, or a polymer) can be used. Specifically, a substance having a hole mobility of $10^{-6}$ cm$^2$/Vs or higher is preferably used. However, any substance other than the above-described materials may also be used as long as the substance has a higher hole-transport property than an electron-transport property.

<Material for Electron-Relay Layer>

The electron-relay layer 1104b can immediately receive electrons drawn out by the acceptor substance in the first charge-generation region 1104c. Therefore, the electron-relay layer 1104b contains a substance having a high electron-transport property, and the LUMO level thereof is positioned between the acceptor level of the acceptor substance in the first charge-generation region 1104c and the LUMO level of the light-emitting unit 1103. Specifically, the LUMO level of the electron-relay layer 1104b is preferably about from −5.0 eV to −3.0 eV.

As the substance used for the electron-relay layer 1104b, for example, a perylene derivative and a nitrogen-containing condensed aromatic compound can be given. Note that a nitrogen-containing condensed aromatic compound is preferably used for the electron-relay layer 1104b because of its stability. Among nitrogen-containing condensed aromatic compounds, a compound having an electron-withdrawing group such as a cyano group or fluorine is preferably used because such a compound further facilitates acceptance of electrons in the electron-relay layer 1104b.

<Material for Electron-Injection Buffer Layer>

The electron-injection buffer layer 1104a facilitates electron injection from the first charge-generation region 1104c into the light-emitting unit 1103a. By providing the electron-injection buffer layer 1104a between the first charge-generation region 1104c and the light-emitting unit 1103a, the injection barrier therebetween can be lowered.

A substance having a high electron-injection property can be used for the electron-injection buffer layer 1104a. For example, an alkali metal, an alkaline earth metal, a rare earth metal, or a compound thereof (e.g., an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)) can be used.

Further, in the case where the electron-injection buffer layer 1104a contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). Note that as the substance having a high electron-transport property, a material similar to the above material for the electron-transport layer which can be formed in part of the light-emitting unit 1103 can be used.

<Method for Manufacturing Light-Emitting Element>

A method for manufacturing the light-emitting element is described. Over the lower electrode, the layers described above are combined as appropriate to form an organic layer. Any of a variety of methods (e.g., a dry process or a wet process) can be used to form the organic layer depending on the material for the organic layer. For example, a vacuum evaporation method, an inkjet method, a spin coating method, or the like may be selected. Note that a different formation method may be employed for each layer. The upper electrode is formed over the organic layer, so that the light-emitting element is manufactured.

The light-emitting element described in this embodiment can be manufactured by combination of the above-described materials. Light emission from the above-described light-emitting substance can be obtained with this light-emitting element, and the emission color can be selected by changing the type of the light-emitting substance.

Further, a plurality of light-emitting substances which emit light of different colors can be used, whereby, for example, white light emission can also be obtained by expanding the width of the emission spectrum. In order to obtain white light emission, for example, a configuration may be employed in which at least two layers containing light-emitting substances are provided so that light of complementary colors is emitted. Specific examples of complementary colors include "blue and yellow", "blue-green and red", and the like.

Further, in order to obtain white light emission with an excellent color rendering property, an emission spectrum preferably spreads through the entire visible light region. For example, a light-emitting element may include layers emitting light of blue, green, and red.

Note that this embodiment can be implemented in an appropriate combination with any of the other embodiments described in this specification.

Example

Figure 7A:
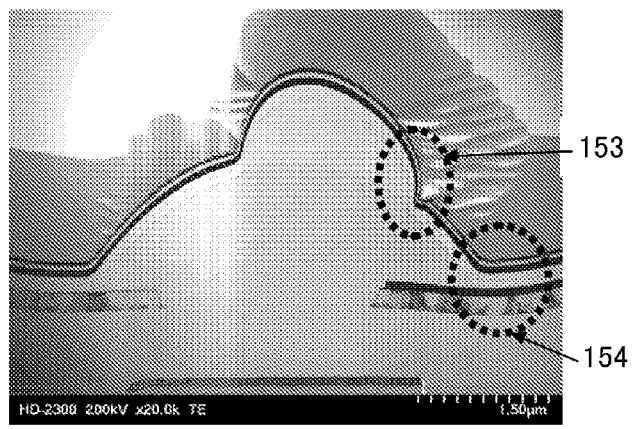
FIG. 7A is a photograph showing a cross-sectional structure of a partition and a spacer of a light-emitting element of Example.
Figure 7B:
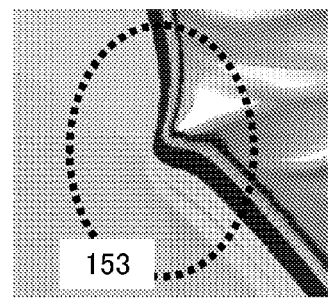
FIG. 7B is an enlarged photograph showing a recess 153 shown in FIG. 7A.
Figure 7C:
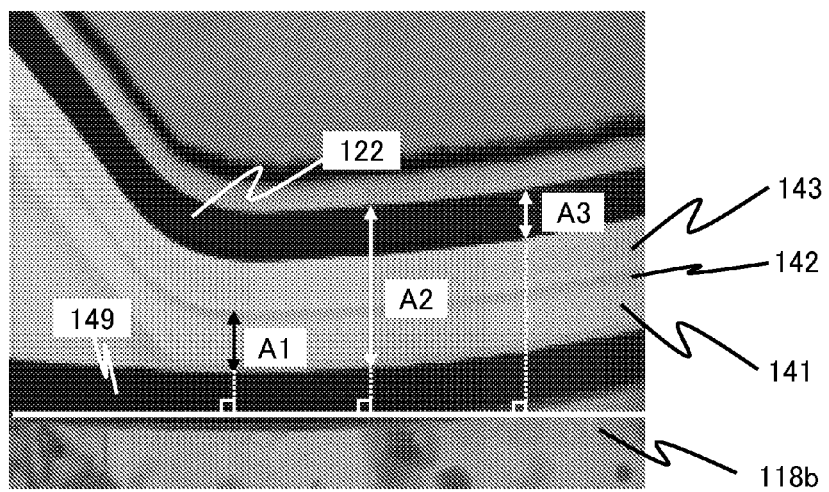
FIG. 7C is an enlarged photograph showing a region 154 shown in FIG. 7A.

FIG. 7A is a photograph showing the cross-sectional structure of a partition and a spacer (projecting object) of a light-emitting element of Example. FIG. 7B is an enlarged photograph showing the recess 153 formed by a side surface of the spacer and a side surface of the partition which is shown in FIG. 7A. FIG. 7C is an enlarged photograph showing the region 154 shown in FIG. 7A.

The position of the spacer 155 in this example is similar to that in FIG. 4B, and the end portion of the spacer 155 is laid out over the inclined portion of the surface of the partition 150.

The materials included in the light-emitting element of this example are given below.

The first lower electrode 118a and the second lower electrode 118b: a stack of an aluminum-nickel alloy film containing lanthanum (thickness: 200 nm) and a titanium film (thickness: 6 nm)

A microcavity structure 149: an indium tin oxide film containing silicon oxide (ITSO) (thicknesses: 0 nm in a light-emitting element included in a blue-light-emitting portion, 40 nm in a light-emitting element included in a green-light-emitting portion, and 80 nm in a light-emitting element included in a red-light-emitting portion)

The partition 150: a brown resist material (a colored insulating material whose transmittance of light having specific wavelengths of 460 nm, 540 nm, and 620 nm is lower than or equal 50%).

The spacer 155: a positive photosensitive polyimide

The first light-emitting unit 141: a composite material layer containing an anthracene derivative having hole transport properties and molybdenum oxide (a hole-injection layer, thickness: 20 nm), a hole-transport layer (thickness: 20 nm), a blue-light-emitting layer (thickness: 30 nm), and an electron-transport layer (thickness: 20 nm)

The intermediate layer 142: a stack of a lithium oxide film (thickness: 0.1 nm), a copper phthalocyanine film (thickness: 2 nm), and a composite material layer containing an anthracene derivative having hole transport properties and molybdenum oxide (thickness: 20 nm)

The second light-emitting unit 143: a stack of a hole-transport layer (thickness: 20 nm), a green-light-emitting layer (thickness: 20 nm), a red-light-emitting layer (thickness: 20 nm), an electron-transport layer (thickness: 30 nm), and an electron-injection layer (thickness: 1 nm)

The upper electrode 122: a stack of a silver-magnesium alloy film (thickness: 15 nm) and ITO (thickness: 70 nm)

A method for manufacturing the light-emitting element of this example is given bellow.

After forming the first and second lower electrodes (anodes) over a TFT substrate, a photoresist film is formed over the first and second lower electrodes, and this photoresist film is exposed to light and developed, whereby a partition formed of a resist material is formed to cover the end portion of each of the first and second lower electrodes. This resist material is a light absorption material colored in brown, for example.

Next, as a positive photosensitive resin, a positive photosensitive polyimide film is formed over the partition, for example, and the positive photosensitive polyimide film is exposed to light and developed, whereby a spacer formed of the positive photosensitive polyimide film is formed over the partition. By forming the spacer using the positive photosensitive resin over the colored partition in such a manner, light is absorbed by the colored partition when the positive photosensitive polyimide film is exposed to light, and thus the temperature of the colored partition is increased, so that light reaction can easily proceed. In the spacer, light reaction can easily proceed particularly at the bottom surface in contact with the colored partition. Accordingly, a structure having a large taper angle (recess) can be formed only by removing the bottom surface in contact with the colored partition. Thus, a structure including a recess is formed with the two-layer structure of the partition and the spacer over the partition.

Next, a first light-emitting unit is formed over the first and second lower electrodes, the partition, and the spacer by an evaporation method, and an intermediate layer is formed over the first light-emitting unit by an evaporation method. The first light-emitting unit includes a hole-injection layer which is a carrier injection layer. Then, a second light-emitting unit is formed over the intermediate layer by an evaporation method, and an upper electrode is formed over the second light-emitting unit. Note that it is preferable that the intermediate layer and the carrier injection layer be reduced in thickness, and the upper electrode be not disconnected.

The colored partition is used in order to reduce viewing angle dependence as well as crosstalk. By coloring the partition, color mixture of light emitted from adjacent pixels which occurs when a panel is seen from an oblique direction can be prevented, which is preferable.

FIGS. 8A to 8C and FIG. 9 are photographs showing cross sections similar to that in FIG. 7B. The height of a recess and the like are described in detail with reference to FIGS. 8A to 8C and FIG. 9.

Figure 8A:
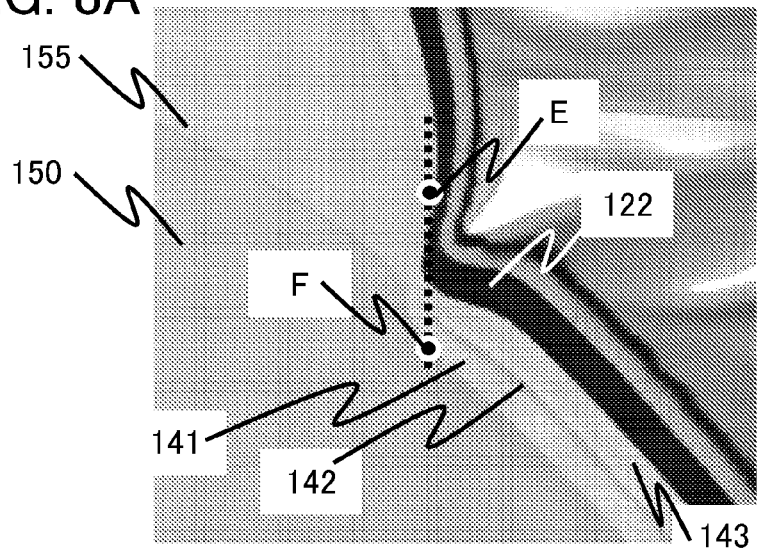
FIGS. 8A to 8C are photographs showing cross sections similar to that in FIG. 7B and used for description of the height of a recess or the like in detail.

As shown in FIG. 8A, a point that is the most protruded point of the spacer 155 is referred to as a point E, and the point of intersection of the partition 150 with a line which is drawn from the point E perpendicular to the surface on which the partition 150 is formed or a surface of the first substrate is referred to as a point F. The distance between the point E and the point F is referred to as the height L1 of the recess. Further, as shown in FIG. 7C, the thickness from the first light-emitting unit 141 to the upper electrode 122 is referred to as the thickness A2, and the thickness from the first light-emitting unit 141 to the intermediate layer 142 is referred to as the thickness A1. Note that the thicknesses A1 and A2 each correspond to a thickness on a perpendicular line drawn to the surface on which the second lower electrode 118$b$ is formed (surface on which the light-emitting element is formed) or the surface of the first substrate.

As to specific sizes in the light-emitting element of this example, the height L1 of the recess is 230 nm, the thickness A1 is 110 nm, and the thickness A2 is 280 nm.

The above height L1, thickness A1, and thickness A2 satisfy the following formula (1).

$$A1 < L1 \leq 2 \qquad (1)$$

Since this example satisfies the above formula (1), the intermediate layer and the carrier injection layer (composite material layer) which have high conductivity and are positioned below the light-emitting layer of the uppermost light-emitting unit are disconnected. In other words, in this example, the spacer is formed over the partition, so that the recess is formed. The height L1 of the recess is greater than the thickness A1 which is a thickness to the intermediate layer of the organic layer and smaller than or equal to the total thickness A2 of the organic layer and the upper electrode. As a result, it is confirmed that the intermediate layer and the carrier injection layer which have especially low resistance in the organic layer can be disconnected. It is also confirmed that as a result of filling a space with a structure in which a side surface of the organic layer is in contact with the most recess, the upper electrode is not disconnected.

As shown in FIG. 7C and FIG. 8A, it is confirmed that the first light-emitting unit and the intermediate layer are disconnected when the height L1 of the recess which is a distance between the points E and F is greater than the thickness A1 from the first light-emitting unit to the intermediate layer. It is also confirmed that the first light-emitting unit and the intermediate layer are disconnected and the upper electrode is not disconnected when the height L1 of the recess which is a distance between the points E and F is smaller than or equal to the thickness A2 from the first light-emitting unit to the upper electrode.

Figure 8B:
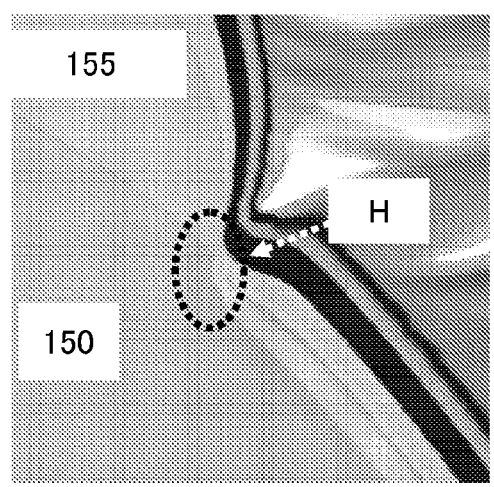

As shown in FIG. 8B, in a region surrounded by a dotted line H, the recess is filled with the organic layer, whereby the height of the recess for the upper electrode becomes lower than the height of the recess for the organic layer.

Figure 8C:
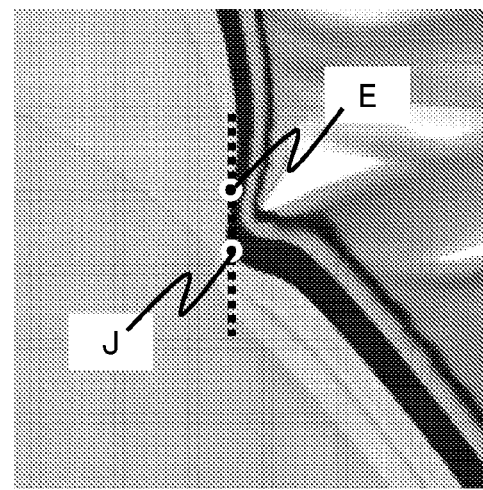

As shown in FIG. 8C, the point of intersection of the surface of the second light-emitting unit with a line which is drawn from the point E perpendicular to the surface on which the partition is formed or the surface of the substrate is referred to as a point J. The distance between the point J and the point E is referred to as the distance L2. This distance L2 corresponds to the height of the recess for the upper electrode, and thus, it is also confirmed that the upper electrode is not disconnected when the distance L2 is smaller than the thickness A3 of the upper electrode. The thickness A3 is a thickness of the upper electrode on a perpendicular line drawn to the surface of the first substrate or the surface on which the lower electrode is formed (surface on which the light-emitting element is formed) (see FIG. 7C).

Figure 9:
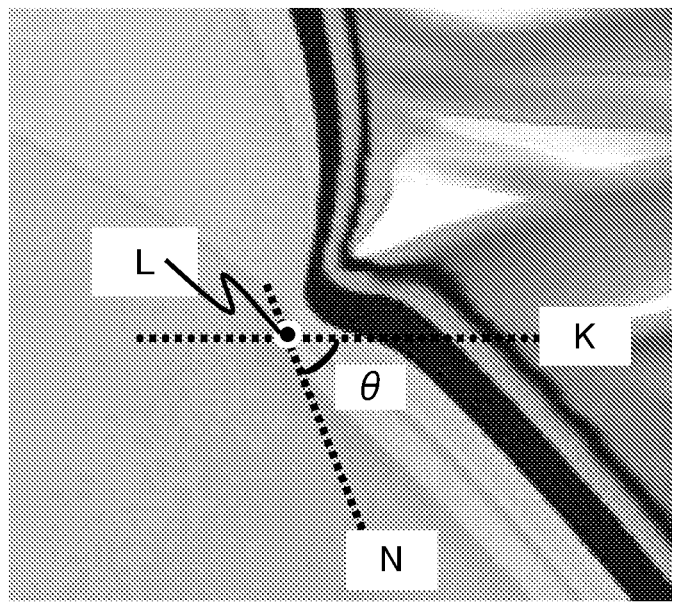
FIG. 9 is a photograph showing cross sections similar to that in FIG. 7B and used for description of the height of a recess or the like in detail.

As shown in FIG. 9, a line connecting a point L which is the most recess and a point apart from the point L with an infinitesimal distance on the partition 150 side is referred to as a line N, and a line parallel to the surface of the substrate is referred to as a line K. In order to form the recess having a height greater than or equal to the thickness to the intermediate layer of the organic layer, it is preferable that an angle θ formed by the line N and the line K be greater than 0 degrees, and the partition 150 be inclined. By making the partition 150 have an inclination in order to increase the height L1 of the recess, the condition in which the height L1 of the recess is greater than the thickness A1 from the first light-emitting unit 141 to the intermediate layer 142 is easily satisfied.

Figure 10:
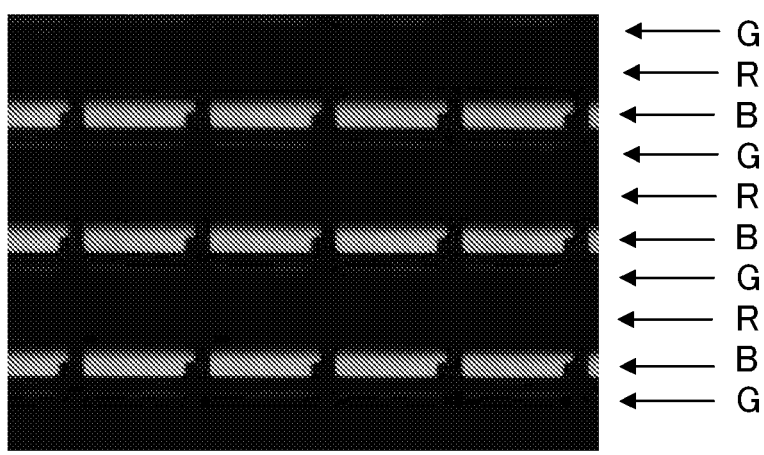
FIG. 10 is a photograph showing a state in which a light-emitting panel including the light-emitting element of Example is displayed with a monochromatic blue light.

FIG. 10 is a photograph showing a state in which a light-emitting panel including the light-emitting element of this example is displayed with a monochromatic blue light of 150 cd/m².

Figure 11A:
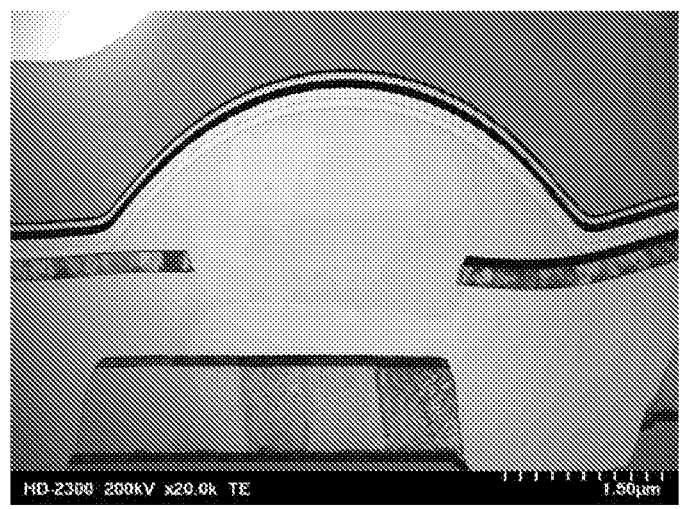
FIG. 11A is a photograph showing a cross-sectional structure of a partition of a comparative light-emitting element.
Figure 11B:
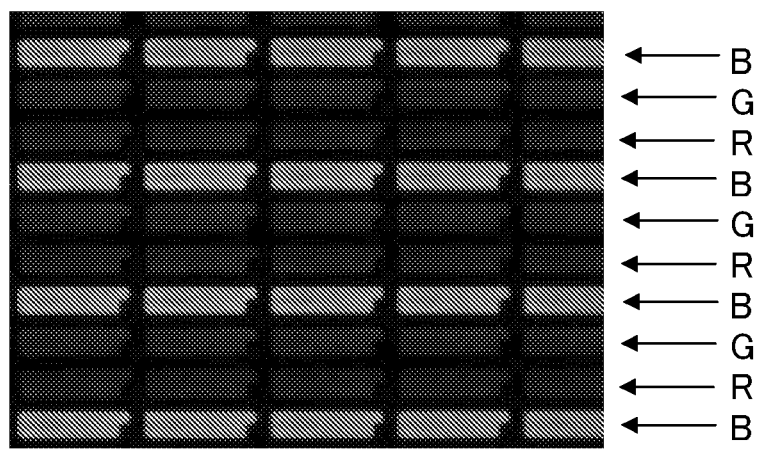
FIG. 11B is a photograph showing a state in which a light-emitting panel including the comparative light-emitting element is displayed with a monochromatic blue light.
Figure 12:
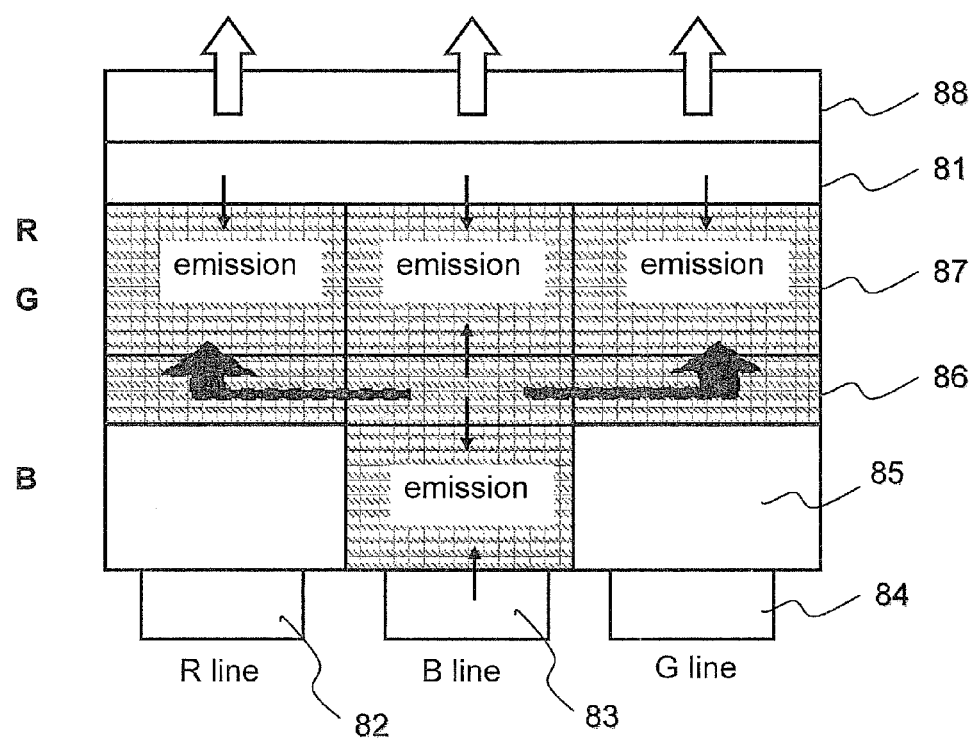
FIG. 12 is a schematic diagram illustrating occurrence of a crosstalk phenomenon due to a highly conductive intermediate layer.
Figure 13:
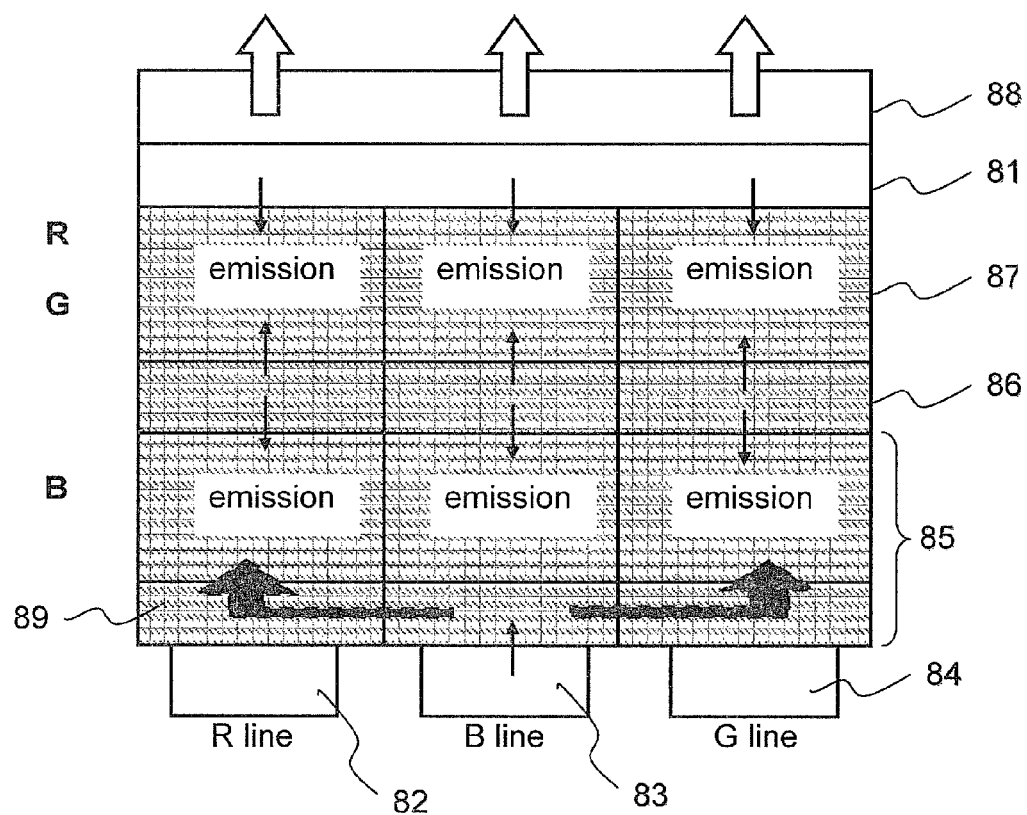
FIG. 13 is a schematic diagram illustrating occurrence of a crosstalk phenomenon due to a highly conductive carrier-injection layer.

FIG. 11A is a photograph showing a cross-sectional structure of a partition of a comparative light-emitting element, and FIG. 11B is a photograph showing a state in which a light-emitting panel including the comparative light-emitting element is displayed with a monochromatic blue light of 150 cd/m².

Note that in FIG. 10 and FIG. 11B, B denotes sub-pixels which emit blue light, G denotes sub-pixels which emit green light, and R denotes sub-pixels which emit red light.

A spacer in the light-emitting element of Example shown in FIG. 7A is excluded in the comparative light-emitting element shown in FIG. 11A. The manufacturing method of the comparative light-emitting element shown in FIG. 11A is the same as that of the light-emitting element of Example except that the spacer is not formed.

In the light-emitting panel including the comparative light-emitting element shown in FIG. 11B, current is leaked into adjacent tandem elements through the intermediate layer having high conductivity and thus a red line and a green line of adjacent pixels emit light, so that a crosstalk phenomenon occurs. In contrast, in the light-emitting panel of this example shown in FIG. 10, since the first light-emitting unit and the intermediate layer having high conductivity are disconnected at the recess formed by the spacer and the partition, it is confirmed that current leakage into adjacent tandem elements through the intermediate layer can be suppressed, and occurrence of a crosstalk phenomenon in which a red line and a green line of adjacent pixels emit light can be suppressed.

This application is based on Japanese Patent Application serial No. 2012-230151 filed with Japan Patent Office on Oct. 17, 2012, the entire contents of which are hereby incorporated by reference.

What is claimed is:

1. A light-emitting device comprising:
a first electrode and a second electrode over an insulating layer;
a partition between the first electrode and the second electrode, the partition positioned over the insulating layer;
a projecting object over the partition;
a first light-emitting unit over the first electrode, the partition, the projecting object, and the second electrode;
an intermediate layer over the first light-emitting unit;
a second light-emitting unit over the intermediate layer; and
a third electrode over the second light-emitting unit,
wherein a recess is formed by a side surface of the projecting object and a side surface of the partition,
wherein a distance between a first point and a second point is greater than a total thickness of the first light-emitting unit and the intermediate layer which are positioned over the first electrode and is smaller than or equal to a total thickness of the first light-emitting unit, the intermediate layer, the second light-emitting unit, and the third electrode which are positioned over the first electrode,
wherein the first point is the most protruded point of the projecting object in a direction parallel to a surface on which the partition is formed, and
wherein the second point is a point of intersection of a surface of the partition with a first line which is drawn perpendicular to the surface on which the partition is formed from the first point.

2. A light-emitting device comprising:
a first electrode and a second electrode over an insulating layer;
a structure having a two-layer structure of a first layer and a second layer over the first layer, the structure being over the insulating layer;
a first light-emitting unit over the first electrode, the structure, and the second electrode;
an intermediate layer over the first light-emitting unit;
a second light-emitting unit over the intermediate layer; and
a third electrode over the second light-emitting unit,
wherein the first layer includes a cusp,
wherein a distance between a first point and a second point is greater than a total thickness of the first light-emitting unit and the intermediate layer which are positioned over the first electrode and is smaller than or equal to a total thickness of the first light-emitting unit, the intermediate layer, the second light-emitting unit, and the third electrode which are positioned over the first electrode,
wherein the first point is the most protruded point of the second layer in a direction parallel to a surface on which the first layer is formed, and
wherein the second point is a point of intersection of a surface of the first layer with a first line which is drawn perpendicular to the surface on which the first layer is formed from the first point.

3. The light-emitting device according to claim 1, further comprising a space between the partition and the side surface of the projecting object.

4. The light-emitting device according to claim 1, wherein the first light-emitting unit and the intermediate layer are disconnected at the projecting object.

5. The light-emitting device according to claim 1, wherein an end portion of the projecting object is positioned over a surface of the partition which is inclined with respect to a surface on which the partition is formed.

6. The light-emitting device according to claim 1, wherein the recess has a convex portion on the partition.

7. The light-emitting device according to claim 1,
wherein a distance between the first point and a third point is smaller than a thickness of the third electrode, and
wherein the third point is a point of intersection of a surface of the second light-emitting unit with the first line.

8. The light-emitting device according to claim 1, wherein the first light-emitting unit comprises a carrier injection layer.

9. The light-emitting device according to claim 1, further comprising:
a first color filter over the first electrode; and
a second color filter over the second electrode,
wherein a color of the first color filter is different from a color of the second color filter.

10. The light-emitting device according to claim 1, wherein the partition includes a light absorption material colored in brown.

11. The light-emitting device according to claim 2, further comprising a space between the first layer and a side surface of the second layer.

12. The light-emitting device according to claim 2, wherein the first light-emitting unit and the intermediate layer are disconnected at the second layer.

13. The light-emitting device according to claim 2,
wherein a distance between the first point and a third point is smaller than a thickness of the third electrode, and
wherein the third point is a point of intersection of a surface of the second light-emitting unit with the first line.

14. The light-emitting device according to claim 2, wherein the first light-emitting unit comprises a carrier injection layer.

15. The light-emitting device according to claim 2, further comprising:
a first color filter over the first electrode; and
a second color filter over the second electrode,
wherein a color of the first color filter is different from a color of the second color filter.

16. The light-emitting device according to claim 2, wherein the first layer includes a light absorption material colored in brown.

17. The light-emitting device according to claim 1,
wherein the partition is a colored partition, and
wherein the projecting object includes a positive photosensitive resin.

18. The light-emitting device according to claim 2,
wherein the first layer is a colored layer, and
wherein the second layer includes a positive photosensitive resin.

19. The light-emitting device according to claim 2,
wherein the structure has a side surface continuous from a side surface of the first layer to a side surface of the second layer.

* * * * *

UNITED STATES PATENT AND TRADEMARK OFFICE
CERTIFICATE OF CORRECTION

| | | |
|---|---|---|
| PATENT NO. | : 9,087,964 B2 | Page 1 of 1 |
| APPLICATION NO. | : 14/054051 | |
| DATED | : July 21, 2015 | |
| INVENTOR(S) | : Kaoru Hatano et al. | |

It is certified that error appears in the above-identified patent and that said Letters Patent is hereby corrected as shown below:

Specification

At column 19, line 45, "$A1<L1\leq2$" should be --$A1 < L1 \leq A2$--

Signed and Sealed this
Twenty-third Day of February, 2016

Michelle K. Lee
*Director of the United States Patent and Trademark Office*